US006390355B1

(12) United States Patent
Jung

(10) Patent No.: US 6,390,355 B1
(45) Date of Patent: May 21, 2002

(54) METHOD FOR FORMING A METALLIC CONTACT ON AN ELECTRONIC PRINTED CIRCUIT BOARD AND A PRODUCT THEREFROM

(75) Inventor: Richard Hanson Jung, Park Ridge, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/389,928

(22) Filed: Sep. 3, 1999

(51) Int. Cl.[7] .......................... B23K 31/00; B23K 1/005
(52) U.S. Cl. ................. 228/248.1; 228/248.5; 219/85.13
(58) Field of Search .................. 228/248.1, 248.5, 228/235.1, 198, 115; 219/85.12, 85.13

(56) References Cited

U.S. PATENT DOCUMENTS

| 5,428,249 | A | * | 6/1995 | Sawayama et al. | |
| 5,573,602 | A | * | 11/1996 | Banerji et al. | |
| 5,674,326 | A | * | 10/1997 | Wrezel et al. | |
| 5,711,866 | A | | 1/1998 | Lashmore et al. | 205/687 |
| 5,871,592 | A | * | 2/1999 | Asagi et al. | |
| 5,981,069 | A | * | 11/1999 | Tani et al. | |
| 6,059,952 | A | * | 5/2000 | Kang et al. | |
| 6,114,413 | A | * | 9/2000 | Kang et al. | |
| 6,184,475 | B1 | * | 2/2001 | Kitajima et al. | |
| 6,214,636 | B1 | * | 4/2001 | Sawayama et al. | |

FOREIGN PATENT DOCUMENTS

| JP | 63177995 A | * | 7/1988 |
| JP | 06126480 A | * | 5/1994 |

* cited by examiner

Primary Examiner—Tom Dunn
Assistant Examiner—Kiley Stoner
(74) Attorney, Agent, or Firm—Sayed Hossain Beladi; Steven A. May

(57) ABSTRACT

A method for forming a metallic contact and manufacturing a product having an electronic component 101 and a printed circuit board 100 (PCB) includes dispensing a slurry solder paste mixture 104 including a metallic powder 105 and an acidic fluid 106, placing electronic component 101 over solder paste dispensed over a surface area of PCB 100, and applying pressure on at least a section of electronic component 101 such that at least a portion of slurry solder paste mixture 104 dispensed on the surface area and in contact with the section of electronic component 101 consolidates into at least one of an inter-metallic compound of hardened solder and a hardened alloy of solder forming the metallic contact between electronic component 101 and said PCB 100.

7 Claims, 3 Drawing Sheets

METHOD FOR FORMING A METALLIC CONTACT ON AN ELECTRONIC PRINTED CIRCUIT BOARD AND A PRODUCT THEREFROM

RELATED FIELD OF THE INVENTION

The invention relates to the field of manufacturing products having electronic circuit board and components, and more specifically, making a metallic contact for soldering the electronic components on the printed circuit board.

BACKGROUND OF THE INVENTION

In all conventional soldering processes, three ingredients are required: flux which cleans surfaces, solder material, and heat to melt the solder. A solder connection or a metallic contact may be made by melting a solder alloy in contact with an electronic component termination coated with a metallic element. At the metallic contact, a metallurgical bond consisting of inter-metallic is then formed. Tight control during the soldering process is necessary because a detrimental inter-metallic condition could also form around the metallic contact depending on time/temperature (diffusion) conditions. Such detrimental inter-metallic conditions includes de-wetting and brittle solder joints. Thermal stress is induced within components, between components, and between component and printed circuit board because of the Coefficient of Thermal Expansion (CTE) mismatches during the temperature excursion of re-flow soldering, which may compromise product quality and reliability.

High-density electronic component assembly on a PCB usually requires re-flow of the solder compound. The small mass of electronic components makes them susceptible to the effects of surface tension of molten solder which could lead to soldering defects such as tombstone and unsolder conditions. To nullify surface tension effects, re-flowing the solder often occurs in an inert gas atmosphere which alters the liquid-gas interface leading to beneficial surface tensions. The most popular method of making electronic interconnections has been with eutectic or near-eutectic compositions of tin and lead. The technology is very mature with thorough understanding of processing, reliability, mechanical properties, electrical properties, and materials science. The eutectic composition for tin-lead is convenient because of its low cost and low melting temperature compared to other solders. The low melting temperature is important because high temperature processing places undesired stress on component packaging, substrates, printed circuit boards and also the material may degrade. Environmental concerns also have changed the soldering process over the years. Clean soldering is now a common requirement because of the concerns raised with ozone depleting solvents once used to remove flux from printed circuit boards. Lead-free soldering is also being evaluated as a means to minimize the hazards posed from disposal of electronic assemblies.

Therefore, there is a need for a soldering process that eliminates or minimizes the application of heat, and can also be used for lead free soldering.

DETAILED DESCRIPTION OF THE PREFERRED EMBODIMENT(S)

Figure 1:
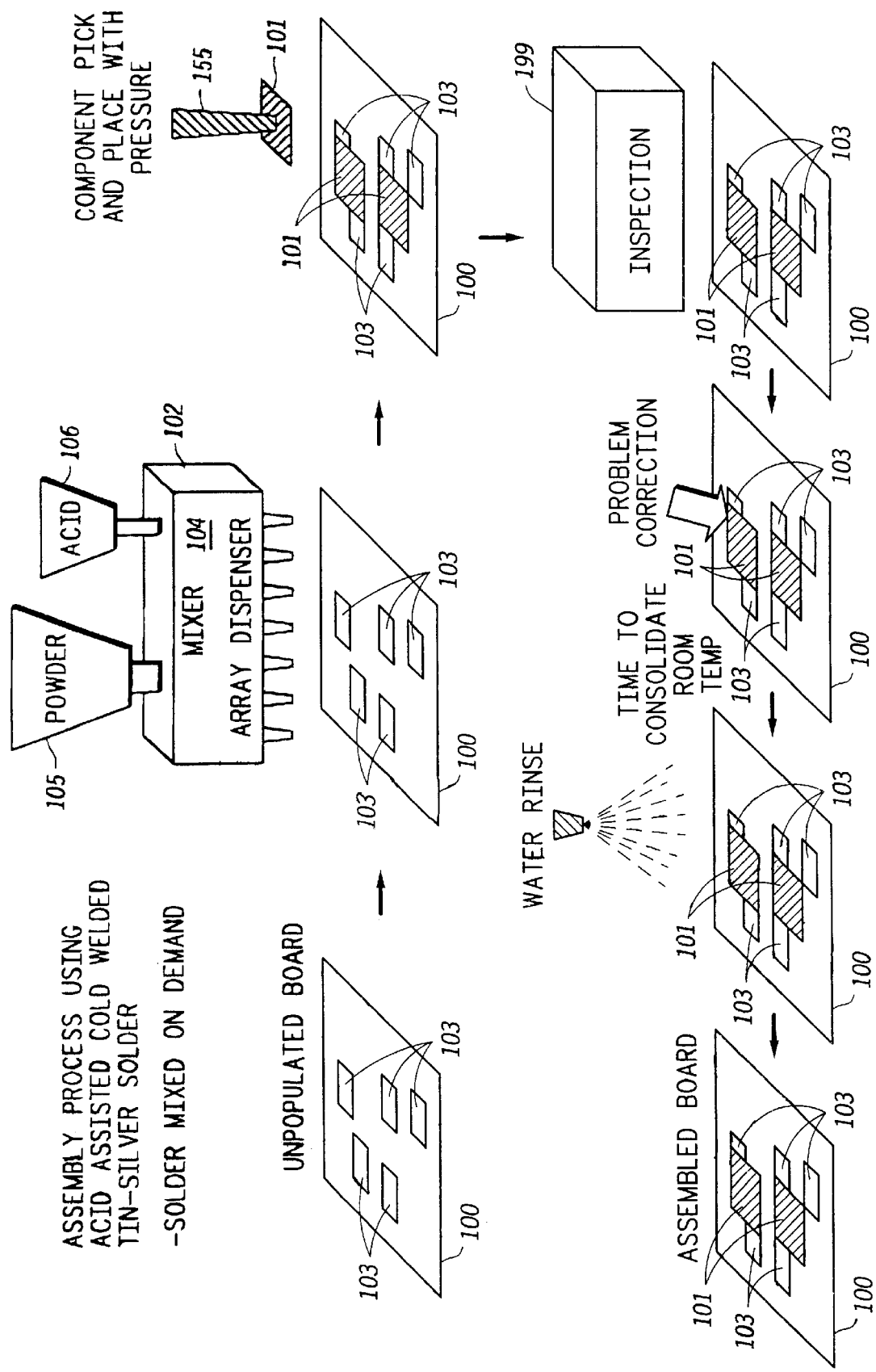
FIG. 1 depicts a series of steps for manufacturing an assembled PCB according to various embodiments of the invention.

The invention provides a method of soldering components to printed circuit boards or substrates which could be performed at room temperature. The materials used in this method have a chemical composition very similar to that proposed for no-lead solders, thus the electrical and mechanical properties should be similar. The materials can be applied using the same equipment used for surface mounting technology (SMT). Components can also be placed or mounted using identical equipment and processing for SMT.

According to various aspects of the invention, a method for forming a metallic contact between an electronic component and a printed circuit board (PCB) includes dispensing a slurry solder paste mixture on at least a surface area of the PCB. The surface area needs to be coated with an element selected from a group of metallic elements essentially including metals in group IB, IIIA and IVA of the Periodic Table. Such elements include silver, gold, and copper. The slurry solder paste mixture essentially includes a metallic powder essentially having a plurality of metallic particles coated with at least a metallic element selected from the group of metallic elements essentially including metals in group IB, IIIA and IVA of the Periodic Table, and an acidic fluid mixed with the metallic powder such that metallic powder and the acidic fluid forming the slurry solder paste mixture. The method further includes placing the electronic component over the solder paste dispensed over the surface area such that a section of the electronic component is in contact with the slurry solder paste mixture dispensed on the surface area of the PCB. The section of the electronic component need coated with a metallic element selected from a group of metallic elements essentially including metals in group IB, IIIA and IVA of the Periodic Table such that it forms a bond with the solder and the surface area coated with a metallic element. Next is applying pressure on at least the section of the electronic component such that at least a portion of the slurry solder paste mixture dispensed on the surface area and in contact with the section of the electronic component consolidates into at least one of an inter-metallic compound of harden solder and a harden alloy of solder. At least one of the inter-metallic compound of harden solder and the harden alloy of solder forms the metallic contact between the electronic component and the PCB.

Furthermore according to various aspects of the invention, rinsing the surface area to wash out at least an excess amount of the acidic fluid from the surface area may be necessary. Applying an ultra violet (uV) ray radiation over the slurry solder paste mixture to activate the acidic fluid for removing oxidation from an outer layer of the metallic particles may facilitate the process. Since acidic fluids react upon contact, the solder mixture may be made before the entire process has started. The acidic fluid is activated upon receiving uV ray radiation. A process according to various aspects of the invention comprising the steps as stated may manufacture a product having a printed circuit board (PCB) and at least an electronic component. Various aspects of the invention may be more apparent by making references to FIGS. 1–3.

FIG. 1 depicts a series of steps for manufacturing an assembled PCB according to various embodiments of the invention. A product having a printed circuit board 100 (PCB) and at least an electronic component 101 may be manufactured by a process including dispensing via a dispenser 102 a slurry solder paste mixture 104 on at least a surface area 103 of PCB 100. Paste mixture 104 essentially consisting of metallic powder and acid can be applied by stencil or screen printing, syringe dispensing, and other conventional solder paste application methods. Surface area 103 coated with an element selected from a group of metallic elements essentially including metals in group IB, IIIA and IVA of the Periodic Table. Slurry solder paste mixture 104 essentially including a metallic powder 105 essentially having a plurality of metallic particles coated with at least a metallic element selected from a group of metallic elements essentially including metals in group IB, IIIA and IVA of the Periodic Table, and an acidic fluid 106 mixed with the metallic powder such that metallic powder 105 and acidic fluid 106 forming slurry solder paste mixture 104. Next is placing electronic component 101 over solder paste mixture 104 dispensed over surface area 103 such that a section of electronic component 101 is in contact with slurry solder paste mixture 104 dispensed on surface area 103 of PCB 100. The section of electronic component 101 coated with a metallic element selected from a group of metallic elements essentially including metals in group IB, IIIA and IVA of the Periodic Table. A pick and place with pressure device 155 applies pressure on at least the section of electronic component 101 such that at least a portion of slurry solder paste mixture dispensed on surface area 103 and in contact with the section of electronic component 101 consolidates into at least one of an inter-metallic compound of harden solder and a harden alloy of solder. At least one of the inter-metallic compounds of harden and harden alloy solder facilitates a metallic contact between the component 101 and PCB 100. As such, the harden alloy of solder or the inter-metallic compound or both form a metallic contact between electronic component 101 and PCB 100 to manufacture the product.

According to further aspects of the invention, the process for manufacturing the product further includes rinsing surface area 103 to wash out at least an excess amount of acidic fluid 106 from surface area 103. Furthermore, the process includes applying an ultra violet ray radiation over slurry solder paste mixture 104 to activate acidic fluid for removing oxidation from an outer layer of the metallic particles in metallic powder 105.

The solder processing according to various aspects of the invention operates by consolidation of metal powders by acid assisted cold welding. A powder of tin metal particles coated with silver or other noble metals is mixed with an acid to form a paste or slurry. The acid acts to chemically reduce metal oxide films on the surface of the powder, component termination, and on the component landing sections on the printed circuit board or substrate. The coating of the metal powder with the nobler metal promotes consolidation because surface oxides are less prone to form and thus can easily be chemically reduced by the acid in the paste. Consolidation includes pressing the solder paste thus bringing the metal powders in close proximity to allow diffusion. As such, a high density solid, or cold weld is produced. In an example, silver and tin that may be present in the powder rapidly diffuse at room temperature and can form a solid. The density of the solid determines the mechanical and electrical properties of the formed metallic contact. Higher solid density allows higher electrical current carrying capability, thermal conductivity, and mechanical strength. The powders are from elements whose binary compounds are fast diffusers at room temperature. Diffusion couples of interest in electronic applications include silver-tin, gold-tin, gold-lead, copper-tin, copper-indium, silver-indium, gold-indium, and similar examples. Diffusion is thought to occur rapidly through interstitial spaces rather than vacancies at room temperature.

Figure 2:
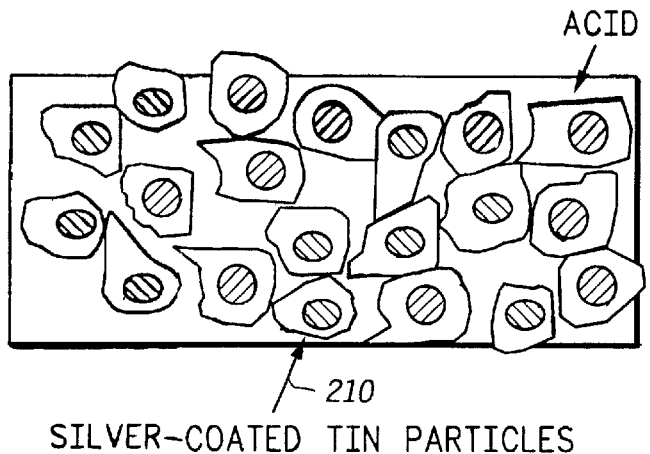
FIG. 2 depicts the state of the slurry solder mixture through graphical representations.
Figure 2:
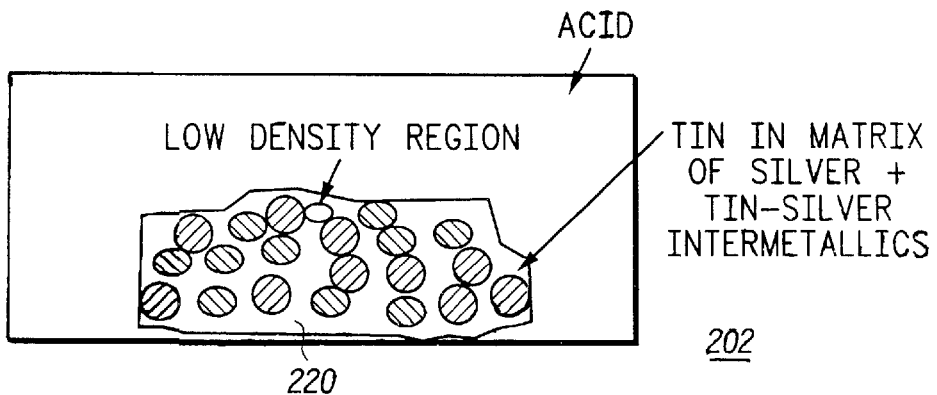
Figure 2:
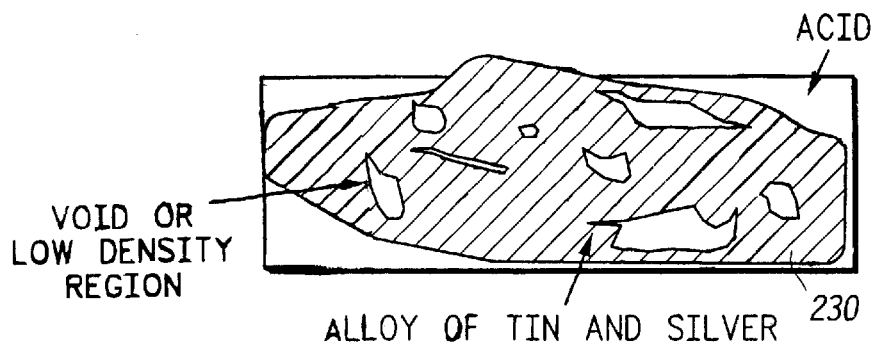

FIG. 2 depicts the state of the slurry solder mixture through graphical representations shown at states 201, 202, and 203. At state 201, the mixture includes uncompressed slurry of metal powder and an acidic fluid. The powder includes, in this example, metal particles 210 made of tin coated with silver element. After consolidation, the mixture may take at least one of the forms shown at state 202 and state 203. A formation including both states 202 and 203 are possible. At state formation 202, the particles after compression at room temperature form a mixture of tin and silver inter-metallic 220. At state formation 203, the particles after consolidation form an alloy 230, made of tin and silver in this example.

Unlike conventional solder pastes whose flux is activated at elevated temperatures, the consolidation paste is activated at room temperature with acid, such as citric acid, ascorbic acid, hydrochloric acid, sulfuric acid, adipic acid, fluoboric acid, etc. Therefore, it is possible that the consolidation paste may have to be prepared immediately prior to use, and its use limited by pot life determined by time for consolidation. The time factor may be remedied by the use of a syringe-array, pin-array dispensing machine which could deliver consolidation paste at required locations. While having the added benefit of eliminating stencils and other similar product specific hard tooling, this paste application method allows premixing of the powder and acid immediately prior to use. Alternatively, activation could be delayed by storing premixed consolidation paste at subzero temperatures. The paste would be thawed prior to use. Alternatively, the acid could be reacted with a binder which renders the acid with no activity until a subsequent reaction occurs. In this fashion, solder paste could be supplied premixed and printed or dispensed as usual. Prior to consolidation, the acid is released by means such as X-ray used in inspection, uV light, or other types of radiation which may dissociate the acid from its binder. Alternatively, a very low activity acid or an acid having activity at elevated temperature could be used in this process which would allow the consolidation paste to be handled like conventional solder paste. In this case, consolidation would occur with a re-flow-type oven set a much lower temperature than re-flow temperature of the solder mixture. Some low heat would aid in the diffusion process. Depending on the acid used, water rinsing may or may not be required to remove the excess after consolidation.

The terminations of the electronic component can then be placed by usual conventional methods onto the dispensed solder paste. The terminations on the components and on the printed circuit board should be coated with one or both of elements that compose the paste. This would allow inter-metallic bonding between the solder and termination necessary for adhesion.

Pressure is necessary to form the cold weld. The pressure may be applied during the machine placement of a component in the pick-and-place process. The areas of highest pressure or force will experience the most consolidation and will have the most mechanical and electrical integrity. However, for those components which cannot be machine placed, the paste could be consolidated manually or automatically by using a dental pick or a similar device to press the paste around the termination or lead. Not unlike z-axis anisotropic materials, non-pressed or non-consolidated materials should have reduced electrical and mechanical performance.

Figure 3:
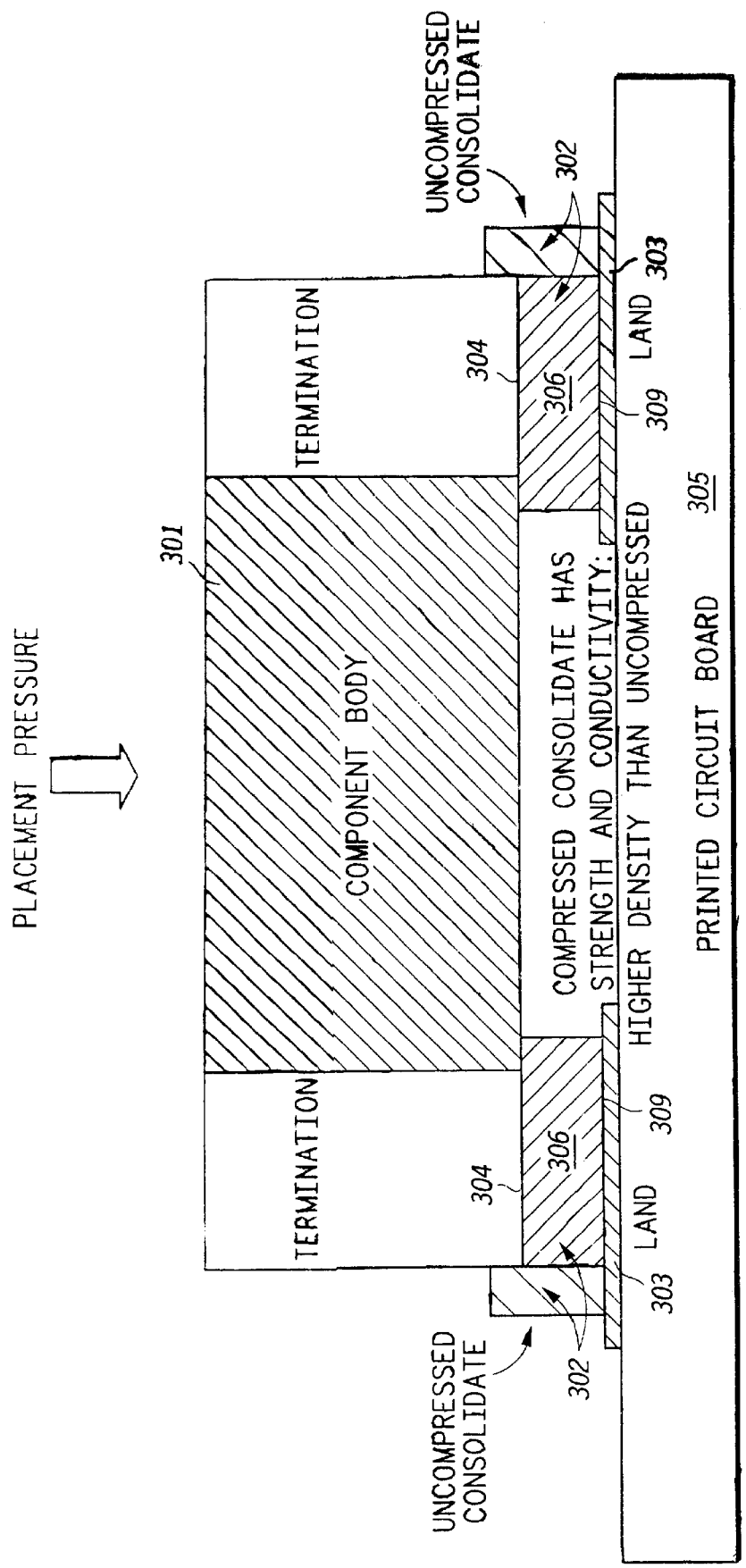
FIG. 3 depicts an electronic component placed over a slurry solder paste mixture dispensed on a surface area of a PCB.

FIG. 3 depicts an electronic component 301 placed over solder paste 302 dispensed over a surface area 303 such that a section 304 of electronic component 301 is in contact with a slurry solder paste mixture 302 dispensed on surface area 303 of a PCB 305. Section 304 of electronic component 301 coated with a metallic element selected from a group of metallic elements essentially including metals in group IB, IIIA and IVA of the Periodic Table. By applying pressure on at least section 304 of electronic component 301 such that at least a portion 306 of slurry solder paste mixture 302 dispensed on surface area 303 and in contact with section 304 of electronic component 301 consolidates into at least one of an inter-metallic compound of harden solder 220 and a harden alloy of solder 230 shown in FIG. 2. At least one of the inter-metallic compound of harden solder 220 and harden alloy 230 of solder forms a metallic contact 309 between electronic component 301 and PCB 305.

The metallic contact formed by this method can be repaired or reworked because the material composition is similar to materials used in conventional solders. Thus, soldering iron, hot plate, or hot air repairing can occur as in a conventionally soldered board. The metallic contact formed by this method can be lead free and has a material or chemical composition which is very similar to no-lead solders, e.g. tin-silver. Thus, this metallic contact material complies with environmental guidelines. The solder formed by this method is expected to have improved fatigue resistance and high temperature mechanical performance because of the higher homologous temperature of a tin-silver solder vs. a conventional tin-lead solder because homologous temperature is equal to (T(operating) minus T(melting))/T(melting). As a result, the lower the homologous temperature, the better the high temperature performance.

Metallic contacts formed according to the invention after applying pressure may have areas in the paste which are compacted by the component to form a cold weld, and such areas show low porosity/high density cross section. Some areas which may have not been compacted would show a relatively high porosity/low density cross section. In these high porosity/low density regions, there would still be retention of sufficient mechanical strength such that loose material or debris would not be prevalent.

The metallic contact formed according to the invention would continue its diffusion process to form a high density solid at room temperature, without heat added acceleration, although the option of applying heat exist for this process. The metallic contact would increase its mechanical strength and electrical conductivity with time, but for the time frame of the manufacturing process, it would be sufficient for electrical testing during a production process.

With the consolidation process occurring at ambient temperature, induced stresses such as temperature stress placed on the solder joint, components, and printed circuit board or substrate during conventional soldering are significantly reduced. Consequently, the overall reliability of the product is enhanced since thermal degradation from heat and/or CTE mismatches has not been initiated within each component and between components and printed circuit board. The thermal expansions and contractions is limited to what is seen during the operation of the product.

Also, the design and manufacturing processes would be significantly simplified using the process according to the invention. Lower production costs would result and faster design and manufacturing cycle times would also be a benefit. With conventional soldering temperatures not being imposed on the components during assembly, products could be designed and modeled for less stringent and more realistic service life conditions. Less expensive packaging materials could be used since induced stresses from soldering are reduced by room temperature consolidation. High temperature or low stress materials would not be required. Accelerated life testing procedures including HASS and HALT may also be simplified since component degradation from conventional soldering would not occur.

The manufacturing process would also be simplified. Re-flow ovens which require power, application of inert gases, floor space, and maintenance would not be required. There would be instances where a low temperature oven may be used to accelerate the diffusion process. Rework or repair would not be an issue since components could be detached and reattached using conventional soldering methods of flux and no-lead solder. Cycle time would be improved because assemblies would not be required to undergo the re-flow process. In-line quality may also be a benefit. Assemblies can be visually or X-ray laminographically inspected, as shown for example in FIG. 1 at inspection 199, during the consolidation process prior to full consolidation. If needed, the components may be replaced or adjusted. With thermal mass for soldering being minimized, the sequence or manner of assembly may be modified to suit the application. Conceivably, an entire product could be manufactured at one work station. There may be a need for a rinsing/cleaning step to remove excess acid which is used in the consolidation process. However, the acids used are relatively mild and non-toxic and can easily be removed by simple water rinsing. On the other hand, acids may be chosen which have limited activity, thus, the acid may be completely consumed during the consolidation process. No cleaning thus may be necessary.

The electrical component may be a leaded or lead-less component. Moreover, the electrical component may be a connector connecting an assembly to the PCB. Some electrical devices such as display devices are not tolerant of heat at any time during the manufacturing process. As such, display devices as the electronic component of the PCB may greatly benefit from the invention. Therefore, the electronic component may be of a type selected from a wide variety of components used in common electronic applications. During the application of pressure over the electronic component, ultra-sonic wave may also be applied to assist the diffusion process.

What is claimed is:

1. A method for forming a metallic contact between an electronic component and a printed circuit board (PCB) at room temperature, the method comprising the steps of:

dispensing a slurry solder paste mixture on at least a surface area of said PCB, wherein said surface area is coated with a metallic element selected from groups IB, IIIA and IVA of the Periodic Table and wherein said slurry solder paste mixture comprises:

a metallic powder having a plurality of metallic particles coated with at least a metallic element selected from groups IB, IIIA and IVA of the Periodic Table;

an acidic fluid mixed with said metallic powder such that said metallic powder and said acidic fluid form said slurry solder paste mixture;

placing said electronic component over said slurry solder paste mixture dispensed over said surface area such that a section of said electronic component is in contact with said slurry solder paste mixture dispensed on said surface area of said PCB, wherein said section of said electronic component is coated with at least a metallic element selected from groups IB, IIIA and IVA of the Periodic Table; and applying pressure on at least said section of said electronic component such that at least a portion of said slurry solder paste mixture dispensed on said surface area and in contact with said section of said electronic component consolidates, at room temperature, into an intermetallic compound comprising at least one of a hardened solder and a hardened alloy of solder that provides said metallic contact between said electronic component and said PCB.

2. The method as recited in claim 1 further comprising the step of rinsing said surface area to wash out at least an excess amount of said acidic fluid from said surface area.

3. The method as recited in claim 1 further comprising a step of applying an ultraviolet ray radiation over said slurry solder paste mixture to activate said acidic fluid for removing oxidation from an outer layer of said metallic particles.

4. A method for forming a metallic contact between an electronic component and a printed circuit board (PCB) at room temperature, the method comprising the steps of:

making a slurry solder paste mixture comprising:
a metallic powder essentially having a plurality of metallic particles;
an acidic fluid mixed with said metallic powder;

dispensing said slurry solder paste mixture on at least a surface area of said PCB, wherein said surface area is coated with a metallic element selected from groups IB, IIIA and IVA of the Periodic Table;

placing said electronic component over said solder paste dispensed over said surface area such that a section of said electronic component is in contact with said slurry solder paste mixture dispensed on said surface area of said PCB;

applying pressure on at least said section of said electronic component such that at least a portion of said slurry solder paste mixture dispensed on said surface area and in contact with said section of said electronic component consolidates into an intermetallic compound comprising at least one of a hardened solder and a hardened alloy of solder at room temperature; and wherein said intermetallic compound forms said metallic contact between said electronic component and said PCB.

5. The method as recited in claim 4 further comprising the step of coating said metallic particles, said surface area of said PCB, and said section of said electrical component with at least a metallic component selected from groups IB, IIIA and IVA of the Periodic Table.

6. The method as recited in claim 4 further comprising the step of rinsing said surface area to wash out at least an excess amount of said acidic fluid from said surface area.

7. The method as recited in claim 4 further comprising a step of applying an ultraviolet ray radiation over said slurry solder paste mixture to activate said acidic fluid for removing oxidation from an outer layer of said metallic particles.

* * * * *